United States Patent [19]
Konopka

[11] Patent Number: 4,783,729
[45] Date of Patent: Nov. 8, 1988

[54] AUTOMATIC VOLTAGE DOUBLER SWITCH

[75] Inventor: John G. Konopka, Barrington, Ill.

[73] Assignee: Zenith Electronics Corporation, Glenview, Ill.

[21] Appl. No.: 101,117

[22] Filed: Sep. 25, 1987

[51] Int. Cl.[4] .............................................. H02M 7/04
[52] U.S. Cl. ..................................... 363/143; 363/60; 323/300
[58] Field of Search ................... 363/60, 61, 142, 143, 363/126; 307/75, 86; 323/299, 300

[56] References Cited

U.S. PATENT DOCUMENTS

| | | | |
|---|---|---|---|
| 3,900,787 | 8/1975 | Koster | 363/143 |
| 4,590,546 | 5/1986 | Maile | 363/143 |
| 4,654,538 | 3/1987 | Lethellier | 363/143 |
| 4,658,345 | 4/1987 | Ingman | 363/143 |
| 4,665,323 | 5/1987 | Russell et al. | 307/75 |

Primary Examiner—Peter S. Wong

[57] ABSTRACT

An automatic voltage doubler switch includes a Triac having a gate electrode that is driven by a relaxation oscillator that includes a Diac switch. A capacitor, charged from a voltage that is indicative of the AC line voltage, triggers the Triac through the Diac switch to complete a conductive path for converting the power supply from a direct operating mode to a voltage doubler operating mode. A cutoff transistor senses the AC line voltage and functions to disable the relaxation oscillator when the AC line is at a particular level. A hysteresis circuit reduces the resistance in the base circuit of a line voltage detector transistor to keep it in conduction despite further drops in line voltage. A hysteresis inhibit transistor operates on power up of the power supply to override the effects of the hysteresis circuit.

5 Claims, 1 Drawing Sheet

4,783,729

AUTOMATIC VOLTAGE DOUBLER SWITCH

BACKGROUND OF THE INVENTION

This invention relates in general to switch mode power supplies and specifically to automatic voltage doubler circuits for such power supplies.

U.S. Pat. No. 4,665,323 entitled ELECTRONICALLY SWITCHABLE POWER SOURCE issued May 12, 1987 in the names of Randy Russell, Wayne Salata and Dennis Stevens and assigned to Zenith Electronics Corporation, describes a DC power source that automatically adapts to either a 120 volt AC or 240 volt AC line input to produce a single range of regulated output voltage. The present circuit accomplishes substantially the same result as the patented circuit with significantly fewer parts, requires much less space and has much lower power consumption. The result is a very attractive automatic voltage doubler circuit arrangement.

The patented circuit utilizes a plurality of comparators for determining when the circuit should switch to the voltage doubler mode. It includes a Triac that is supplied with a DC trigger voltage for switching between the two operating modes. In contrast, the present invention uses a Triac that is supplied with short duration, high energy trigger pulses from a relaxation oscillator for operating the power supply in its voltage doubler mode. The relaxation oscillator is inhibited when the power supply operates in the direct mode.

OBJECTS OF THE INVENTION

A principal object of the invention is to provide a novel automatic voltage doubler switch.

Another object of the invention is to provide an automatic voltage doubler switch for a pulse width modulator (PWM) power supply that is simpler and more economical than prior art devices.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
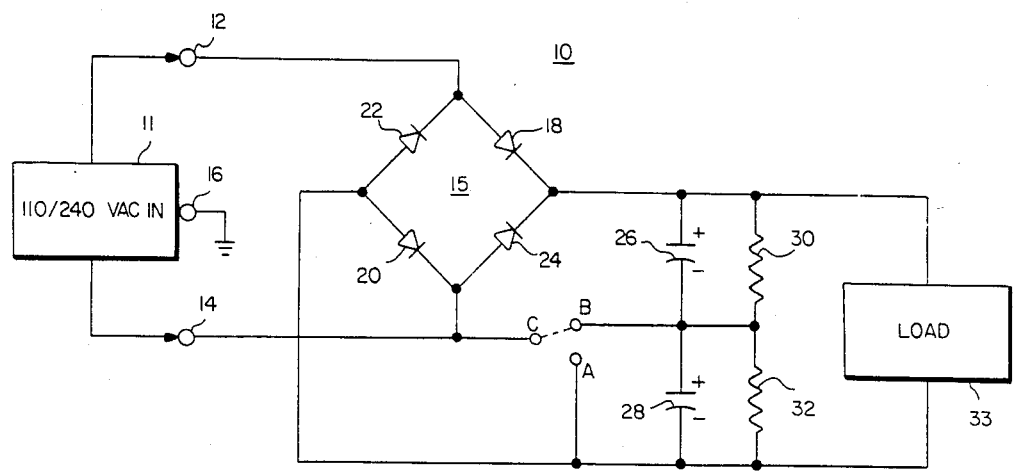
FIG. 1 is a partial schematic diagram of a prior art DC power supply that is operable in either a direct voltage or a voltage doubler mode.

A two mode power supply, generally designated by the reference numeral 10, is connectable to a source of AC line voltage 11. AC line voltage source 11 may comprise either 120 volts AC or 240 volts AC connected across a pair of input terminals 12 and 14 of a rectifier arrangement 15. A ground terminal 16 generally indicates a chassis ground. Rectifier arrangement 15 comprises four power diodes 18, 20, 22 and 24 connected in a bridge configuration, with the anode of diode 18 and the cathode of diode 22 being connected to input terminal 12 and the anode of diode 24 and the cathode of diode 20 being connected to input terminal 14. The anodes of diodes 20 and 22 are connected together and form the common connection of the power supply, generally indicated by a terminal A. The cathodes of diodes 18 and 24 are connected together and form the positive output terminal of the power supply and are connected to a series arrangement of capacitors 26 and 28 that is bridged by series connected resistors 30 and 32. The junction of the resistors and the capacitors is connected to a terminal B. Input terminal 14 is connected to a terminal C, which is connectable to terminal B, as indicated by the dashed line between terminals C and B. A load 33 is connected across resistors 30 and 32.

The operation of the power supply arrangement 10 is relatively straightforward. With terminals B and C disconnected from each other, the direct operating mode is achieved. Assuming a positive voltage at input terminal 12, current flow is through diode 18, capacitors 26 and 28 in series, diode 20 and back to input terminal 14. If a negative voltage is present at input terminal 12 and a positive voltage at input terminal 14, positive current flow extends from input terminal 14, through diode 24, capacitors 26 and 28, diode 22 and back to input terminal 12. Thus the voltage across load 33 is the peak of the AC voltage between input terminals 12 and 14. With terminals B and C shorted, the voltage doubler mode is attained. In that instance, with a positive potential at input terminal 12, current flow traverses diode 18, capacitor 26, the B-C connection and input terminal 14. With reverse polarity, current flow is from input terminal 14, through the connection between B and C, capacitor 28 and diode 22 to input terminal 12. Thus the full peak voltage of the source 11 appears across each of the capacitors 26 and 28 and adds to produce a doubled voltage output.

The patented circuit, as mentioned, is effective for making a conductive connection between terminals B and C when the voltage doubler mode is desired. The circuit of the invention also makes a conductive connection between terminals B and C to initiate the voltage doubler operating mode, but does so with simpler apparatus to achieve a very reliable, compact, cost effective system.

Figure 2:
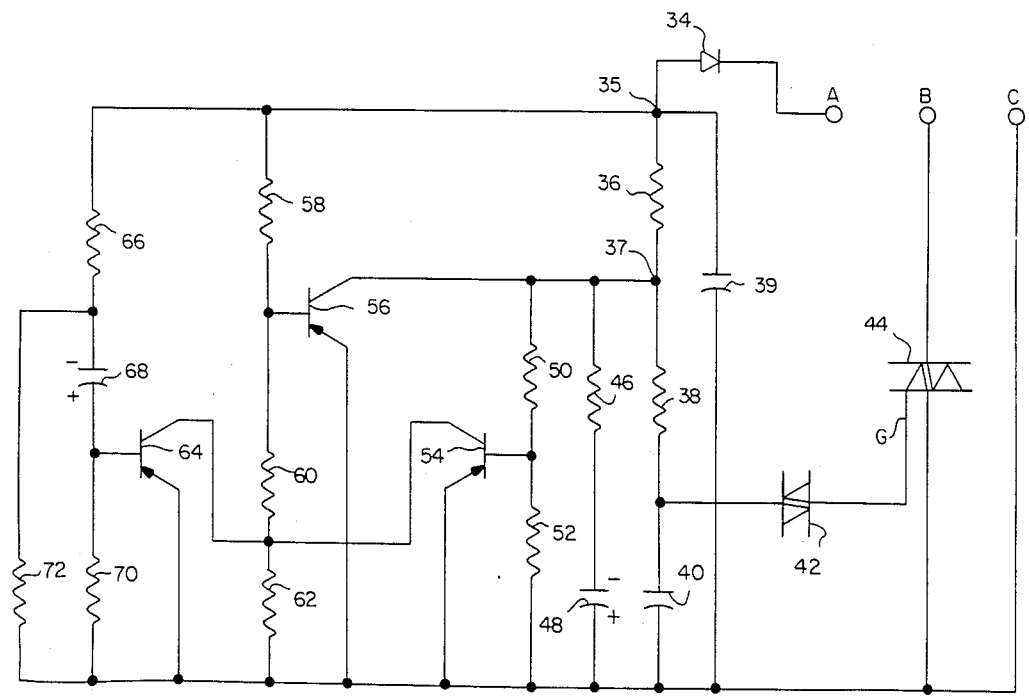
FIG. 2 is a schematic diagram of an electronic switch of the invention for use with the power supply of FIG. 1.

In FIG. 2, terminals A, B and C are shown with a diode 34 having its cathode connected to terminal A and a Triac 44 having its conduction terminals connected between terminals B and C. An electrolytic capacitor 39 connects the anode of diode 34 to terminal C, with the anode of diode 34 establishing a junction 35. A relaxation oscillator circuit is connected from junction 35 to the gate electrode G of Triac 44. Specifically, a pair of resistors 36 and 38 are serially connected between junction 35 and the junction of a capacitor 40 and a Diac 42, with the other end of Diac 42 being connected to the gate electrode G of Triac 44. A delay circuit, consisting of a resistor 46 and an electrolytic capacitor 48, is connected across resistor 38 and capacitor 40. In practice, capacitor 40 has a value of about 0.01 microfarads whereas capacitor 48 has a value of about 10 microfarads. The delay circuit prevents operation of the relaxation oscillator during power up, that is turn on, of the power supply.

A doubler cutoff circuit consists of a PNP cutoff transistor 56 having its collector connected to a junction 37 formed between resistors 36 and 38 and its emitter connected to terminal C. A voltage divider, consisting of series connected resistors 58, 60 and 62, bridges junction 35 and terminal C, with the junction of resistors 58 and 60 being connected to the base of cutoff transistor 56.

A hysteresis circuit includes a PNP transistor 54 having its collector connected to the junction of resistors 60 and 62, its emitter connected to terminal C and its base connected to a voltage divider, consisting of resistors 50 and 52, that bridges junction 37 and terminal C. Finally, a hysteresis inhibit circuit includes a transistor 64 having its collector connected to the junction of resistors 60 and 62, its emitter connected to terminal C and its base connected to another charging circuit. This charging circuit includes a resistor 66 in series with a capacitor 68 and a resistor 70, all of which are connected between junction 35 and terminal C. It is effective to disable the hysteresis circuit during power up of the power supply. The base of transistor 64 is connected to the junction of capacitor 68 and resistor 70. A resistor 72 is connected from the junction of resistor 66 and capacitor 68 to terminal C to limit the voltage developed across capacitor 68.

In operation, junction 35 has a potential which is directly related to the peak of the AC line voltage input. Under normal conditions, the voltage at junction 35 is near the negative peak. Diac 42 becomes conductive when a certain voltage differential is applied across its terminals. Specifically, Diac 42 conducts when the voltage across capacitor 40 reaches −30 volts. Upon turn on or power up of the power supply, the potential at terminal 35 begins to rise from zero toward its −160 volt normal voltage, which is the peak of the assumed 120 volt AC line voltage input. Capacitor 48, which is initially discharged, begins to charge through resistor 46 and resistor 36. Resistor 46 is small, having a value of about 10 ohms. (This resistor limits the discharge current when cutoff transistor 56 is in conduction.) Charging current for capacitor 48 passes through resistor 36, creating a time delay at junction 37. This delay (in voltage developed at junction 37) defeats the relaxation oscillator of which capacitor 40 and Diac 42 are a part for approximately 150 milliseconds.

As the potential at junction 35 rises, capacitor 40 charges through resistors 36 and 38. When the voltage on capacitor 40 reaches −30 volts, Diac 42 is driven conductive to deliver a large current pulse to gate electrode G of Triac 44. Triac 44 is driven conductive and shorts terminals B and C together which, as reference to FIG. 1 will readily show, puts the power supply in its voltage doubler operating mode. Under normal voltage doubler operation, the stored energy of capacitor 40 is discharged into the gate of Triac 44 through Diac 42. When the current through Diac 42 is insufficient to sustain conduction, Diac 42 cuts off. Resistor 38 limits (isolates) the current flow to Diac 42, which would otherwise draw current from the low impedance source formed by capacitor 48 and resistor 46. When the Diac cuts off, the cycle repeats with capacitor 40 again charging, with a negative voltage ramp, until the breakdown voltage for Diac 42 is reached, at which point another pulse of current is applied to gate electrode G of Triac 44. As will be readily appreciated by those skilled in the art, a 60 cycle AC potential is applied to terminals B and C and Triac 44 needs only a single pulse during each cycle to conduct for the remaining portion of the cycle. The frequency of the relaxation oscillator, which includes resistors 36, 38, capacitor 40 and Diac 42, is about 2 kilohertz, thus assuring that a gating pulse will always be available at a correct portion of the 60 Hz cycle to assure firing of Triac 44. Also the current delivered to the gate electrode of the Triac has a peak value on the order of one ampere and is considerably more than adequate to assure consistent firing of the Triac. As those skilled in the art will also readily appreciate, the firing of the Triac with 2 kilohertz bursts of gate current uses substantially less energy than firing the Triac with a DC trigger voltage of 10 milliamperes, which is the minimum requirement for reliable triggering.

Voltage doubler action is only desired when the voltage of the incoming AC source is below a predetermined level. Since the voltage at junction 35 monitors the peak line input voltage, a rise in this voltage to −220 volts DC is used as the determining point for terminating the voltage doubler operating mode and reverting to the direct mode of operation.

The direct mode of operation is achieved by cutoff transistor 56 being driven conductive and effectively shorting out junction 37 to disable the relaxation oscillator. Under normal voltage doubler operation, the potential at junction 37 develops a forward bias for hysteresis transistor 54 because its base is connected to the junction of resistors 50 and 52 which is exposed to this potential. When hysteresis transistor 54 conducts, it effectively shorts out resistor 62 and alters the ratio of the voltage divider that supplies the base circuit of cutoff transistor 56. The effect of shorting out resistor 62 is to require a significantly higher voltage (i.e., −220 volts) at junction 35 in order for cutoff transistor 56 to conduct. Assuming that the voltage at junction 35 rises to that level, cutoff transistor 56 conducts and effectively places a short circuit across capacitor 48 which discharges through resistor 46 and the collector-emitter junction of cutoff transistor 56. Junction 37 effectively goes to the common voltage of terminal C and hysteresis transistor 54 is driven out of conduction since its base drive is lost. Thus the short circuit across resistor 62 is removed and the base resistance of cutoff transistor 56 becomes resistors 60 and 62 in series. The effect is that the potential at junction 35 will have to fall (in a negative sense) to −120 volts in order for cutoff transistor 56 to lose base drive and go out of conduction. This arrangement provides a range of AC line voltages for subsequent operations of cutoff transistor 56 and precludes the system from hunting because of line voltage changes. In essence, the circuit will operate in the voltage doubler mode until 155 volt RMS AC line is achieved in which event it will revert to the direct mode. Thereafter it will not switch to the voltage doubler mode until the AC line voltage drops to 85 volts AC RMS.

A hysteresis inhibit circuit is included to prevent conduction of cutoff transistor 56 at low line voltage during power up of the supply. Upon powr up, capacitor 68 rapidly charges through resistor 66 and the base-emitter circuit of transistor 64. Transistor 64, in conducting, places a short circuit across resistor 62. As capacitor 68 charges, the current through the base of transistor 64 decreases until the base current is no longer sufficient to keep in it conduction. However, for about 200 milliseconds, resistor 62 is shorted out, which is a sufficient time period for hysteresis transistor 54 to be driven conductive and maintain the short thereacross. Therefore cutoff transistor 56 will not conduct until the potential at junction 35 is normalized. As mentioned, resistor 72 precludes excessive voltage being developed across capacitor 68.

The circuit of the invention thus provides an automatic voltage doubler switch for a power supply that is effective, yet simple and economical. It is recognized that changes in the described embodiment of the invention will be apparent to those skilled in the art without departing from its true spirit and scope. The invention is to be limited only as defined in the claims.

What is claimed is:

1. An automatic voltage doubler circuit comprising:
   rectifying means coupled to an AC line and selectively operable in either a diect mode or in a voltage doubler mode;
   switch means for changing the operating mode of said rectifying means;
   charging means responsive to a first voltage level on said AC line for operating said switch means;
   cutoff means for disabling said charging means responsive to a second voltage level on said AC line; and
   delay means coupled to said charging means for disabling said charging means during power up of said rectifying means.

2. The circuit of claim 1 wherein said switch means comprises a Triac and wherein said charging means includes a Diac and a resistance/capacitance network coupled to said Triac through said Diac.

3. The circuit of claim 2, further including hysteresis means establishing a range of AC line voltage levels for said cutoff means.

4. The circuit of claim 3, further including hysteresis inhibiting means for inhibiting opration of said hysteresis means during power up of said rectifying means.

5. An automatic voltage doubler circuit comprising:
   rectifying means, having direct and voltage doubler modes of operation, coupled to an AC line;
   Triac switch means for changing the operating mode of said rectifying means to said doubler mode;
   self-oscillating pulse means, for triggering said Triac means into conduction, oscillating at a frequency that is greater than the frequency of said AC line;
   a cutoff transistor for disabling said oscillating means in response to a first voltage level of said AC line;
   hysteresis means coupled to said cutoff transistor for delaying subsequent operation of said cutoff transistor until a second voltage level of said AC line; and
   transistor means for disabling said hysteresis means upon power up of said power supply.

* * * * *